(12) United States Patent
Jo

(10) Patent No.: US 7,490,193 B2
(45) Date of Patent: Feb. 10, 2009

(54) FLASH MEMORY DEVICES WITH MMC INTERFACES AND METHODS OF OPERATING THE SAME

(75) Inventor: Seong-kue Jo, Gyeonggi (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 282 days.

(21) Appl. No.: 11/247,815

(22) Filed: Oct. 11, 2005

(65) Prior Publication Data

US 2006/0282609 A1    Dec. 14, 2006

(30) Foreign Application Priority Data

Jun. 13, 2005    (KR) ...................... 10-2005-0050468

(51) Int. Cl.
*G06F 12/00* (2006.01)

(52) U.S. Cl. ............................. 711/103; 711/115; 713/2

(58) Field of Classification Search ................. 711/100, 711/103, 4, 200, 202, 203, 204, 205, 206, 711/207

See application file for complete search history.

(56) References Cited

U.S. PATENT DOCUMENTS

| 5,473,563 | A | 12/1995 | Suh et al. ................ 365/185.13 |
|---|---|---|---|
| 7,287,703 | B2 | 10/2007 | Son et al. |
| 2004/0164170 | A1 | 8/2004 | Krygier et al. |
| 2004/0186946 | A1* | 9/2004 | Lee ............................. 711/103 |
| 2004/0232247 | A1* | 11/2004 | Tsunoda et al. ............. 235/492 |
| 2005/0005045 | A1 | 1/2005 | Yong-hyeon |
| 2005/0021895 | A1 | 1/2005 | Son et al. |
| 2006/0064575 | A1* | 3/2006 | Jo ................................. 713/2 |

FOREIGN PATENT DOCUMENTS

| JP | 2003-022427 | 1/2003 |
|---|---|---|
| JP | 2004-086353 | 3/2004 |
| JP | 2004-272400 | 9/2004 |
| KR | 1020040078901 | 9/2002 |
| KR | 10-2003-0068614 | 10/2003 |

* cited by examiner

*Primary Examiner*—Donald Sparks
*Assistant Examiner*—Matthew Bradley
(74) *Attorney, Agent, or Firm*—Myers Bigel Sibley & Sajovec, P.A.

(57) ABSTRACT

An MMC form-factor flash memory device can include a non-volatile memory cell array and a multimedia card interface circuit that is configured to interface with an external host system using a multimedia card communication protocol. A peripheral circuit is configured to control read/program/erase operations of the non-volatile memory cell array under the control of the multimedia card interface circuit, wherein the non-volatile memory cell array, the multimedia card interface circuit, and the peripheral circuit are on a single integrated circuit chip. Related methods of operating are also disclosed.

18 Claims, 4 Drawing Sheets

FLASH MEMORY DEVICES WITH MMC INTERFACES AND METHODS OF OPERATING THE SAME

CROSS-REFERENCE TO RELATED APPLICATION

This application claims priority of Korean Patent Application No. 2005-50468, filed on Jun. 13, 2005, in the Korean Intellectual Property Office, the disclosure of which is incorporated herein in its entirety by reference.

FIELD OF THE INVENTION

The present invention relates to a semiconductor memory and, more particularly, to a flash memory and a memory card system including the same.

BACKGROUND

The multimedia card (MMC) is a universal low cost data storage and communication medium. It is designed to cover a wide area of applications such as smart phones, digital cameras, personal digital assistants (PDAs), digital recorders, MP3 players, pagers. Its targeted features include high mobility and high performance at a low cost. High performance can be expressed in terms of low power consumption and high data throughput at the memory card interface.

A conventional multimedia card 10 is illustrated in FIG. 1. The multimedia card 10 can include a flash memory core 12 and a card interface controller 14, which each have a single chip. That is, the multimedia card 10 has two chips. The flash memory core 12 includes a NAND flash memory that is well known in the art. The card interface controller 14 can act as an interface between a host 20 and a flash memory 12 and includes a CPU 31, a ROM 32, an MMC block 33, a buffer RAM 34, and a flash interface block 35. Firmware is stored in the ROM 32 to manage the flash memory 12. The CPU 31 manages the flash memory core 12 using the firmware stored in the ROM 32. The buffer RAM 34 is used as a work RAM and is used to temporarily store data transmitted between the host 20 and the flash memory 12.

An example of the flash memory 12 illustrated in FIG. 1 is discussed in U.S. Pat. No. 5,473,563 entitled "NONVOLATILE SEMICONDUCTOR MEMORY", which is incorporated herein by reference.

Since the buffer RAM 34 is used as a work RAM, it should have a high capacity (e.g., tens of kilobytes). In a case where a high-capacity buffer RAM and a flash memory 12 are merged into a single chip, an area occupied by the high-capacity buffer RAM 34 is larger than an area of the flash memory 13, i.e., a chip size increases. Further, it may be difficult to fabricate the CPU 31 and the ROM 32 with the flash memory 12.

SUMMARY

Embodiments according to the invention can provide flash memory devices with MMC interfaces and methods of operating the same. Pursuant to these embodiments, a flash memory device can include a non-volatile memory cell array and a multimedia card interface circuit that is configured to interface with an external host system using a multimedia card communication protocol. A peripheral circuit can be configured to control read/program/erase operations of the non-volatile memory cell array under the control of the multimedia card interface circuit, wherein the non-volatile memory cell array, the multimedia card interface circuit, and the peripheral circuit are on a single integrated circuit chip.

In some embodiments according to the invention, the non-volatile memory cell array is configured to store card identification information and card firmware code. In some embodiments according to the invention, the multimedia card interface circuit includes a register configured to store the card identification information read out of the non-volatile memory cell array by the peripheral circuit during power-up of the flash memory device.

In some embodiments according to the invention, the multimedia card interface circuit is configured to output the card firmware code to the host system in response to a command from the host system after completion of a card identification mode. In some embodiments according to the invention, the multimedia card interface circuit includes a state machine circuit and a host interface circuit that is configured to communicate with the host system using the multimedia card interface protocol according to control of the state machine circuit. A flash interface circuit is configured to control the peripheral circuit according to control of the host interface circuit and a buffer RAM is coupled between the host interface circuit and the flash interface circuit, and is configured to temporarily store transfer data.

In some embodiments according to the invention, a flash memory device includes a non-volatile memory cell array and a multimedia card interface circuit that includes a state machine circuit that is configured to receive and apply physical addresses from an external host system to the non-volatile memory array for access thereto.

In some embodiments according to the invention, the state machine circuit is further configured to transfer card firmware code from the non-volatile memory to the external host system. In some embodiments according to the invention, the card firmware code is configured to translate logical addresses to physical addresses when executed locally by the external host system. In some embodiments according to the invention, the state machine circuit is further configured to receive the physical addresses from the external host system.

In some embodiments according to the invention, the state machine circuit is configured to provide operations of the memory device without a local CPU circuit in the device. In some embodiments according to the invention, the device is free of a volatile local buffer ram sufficient to store and operate the card firmware code.

In some method embodiments according to the invention, a method of operating a flash memory device includes transferring card firmware code stored in the flash memory device to an external host system upon power-up of the flash memory device and receiving logical-to-physical translated addresses of flash memory locations at the flash memory device. The flash memory locations can be accessed using the logical-to-physical translated addresses.

DESCRIPTION OF EMBODIMENTS ACCORDING TO THE INVENTION

Figure 1:
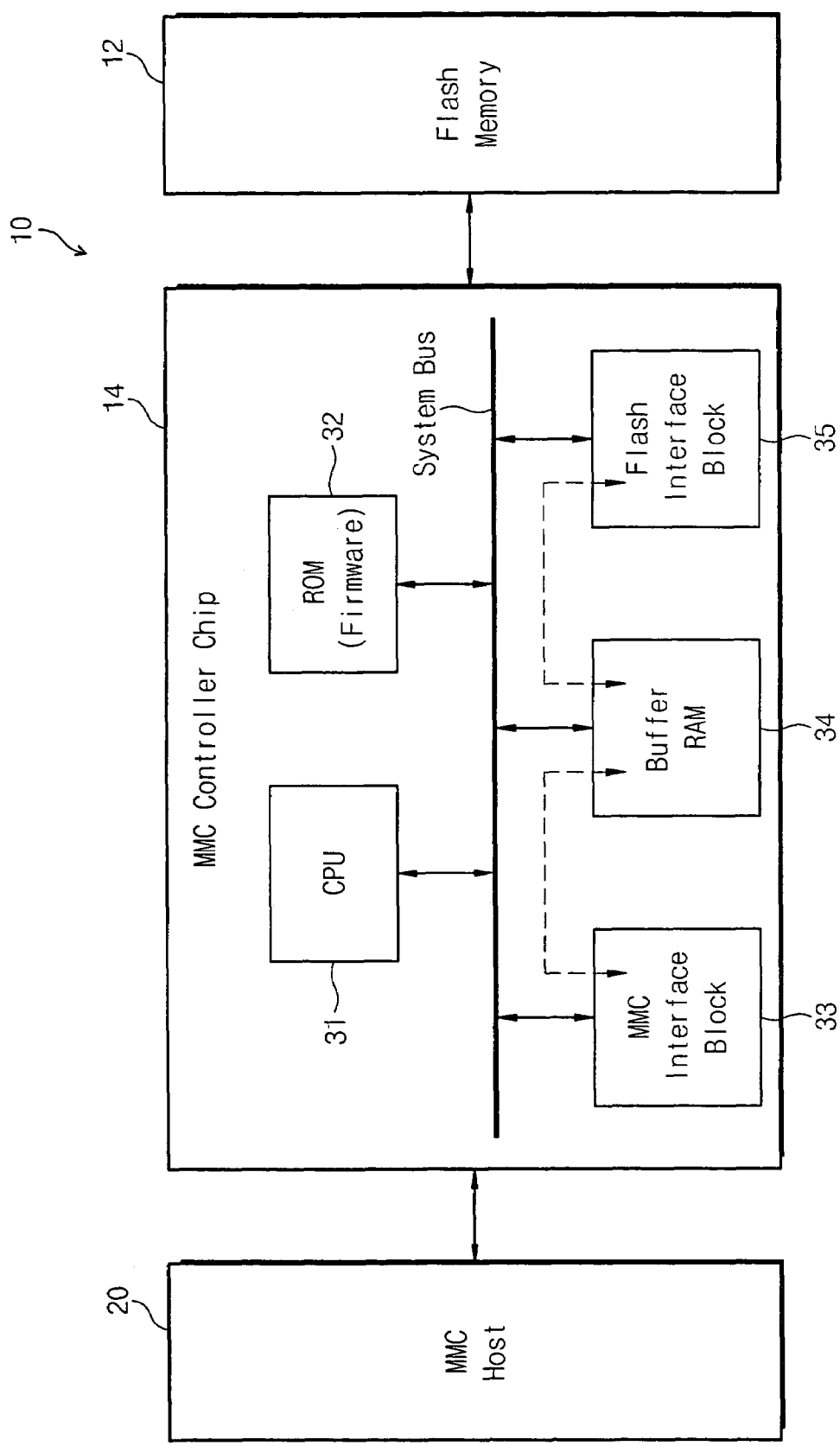
FIG. 1 is a block diagram of a conventional memory system.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element s referred to as being "connected to" or "coupled to" another element, it can be directly connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "form-factor" means the physical size and shape of the MMC memory device. Moreover, the form-factor of memory devices according to some embodiments of the invention is described herein as a Multi-Media Card (MMC)/Secure Digital memory card that has a size and shape that allows such memory cards to be used with other compliant devices, such as readers. As known to those skilled in the art, SD represents a later developed version of the MMC standard, which may allow MMC compliant memory cards to be used with SD compliant devices. In some embodiments according to the invention, MMC/SD form-factor compliant devices measure about 32 mm×about 24 mm×about 1.4 mm. The MMC and SD standards, such as protocols used for communications" are discussed further on the world-wide-web at "www.mmca.org," which is incorporated herein by reference.

Figure 2:
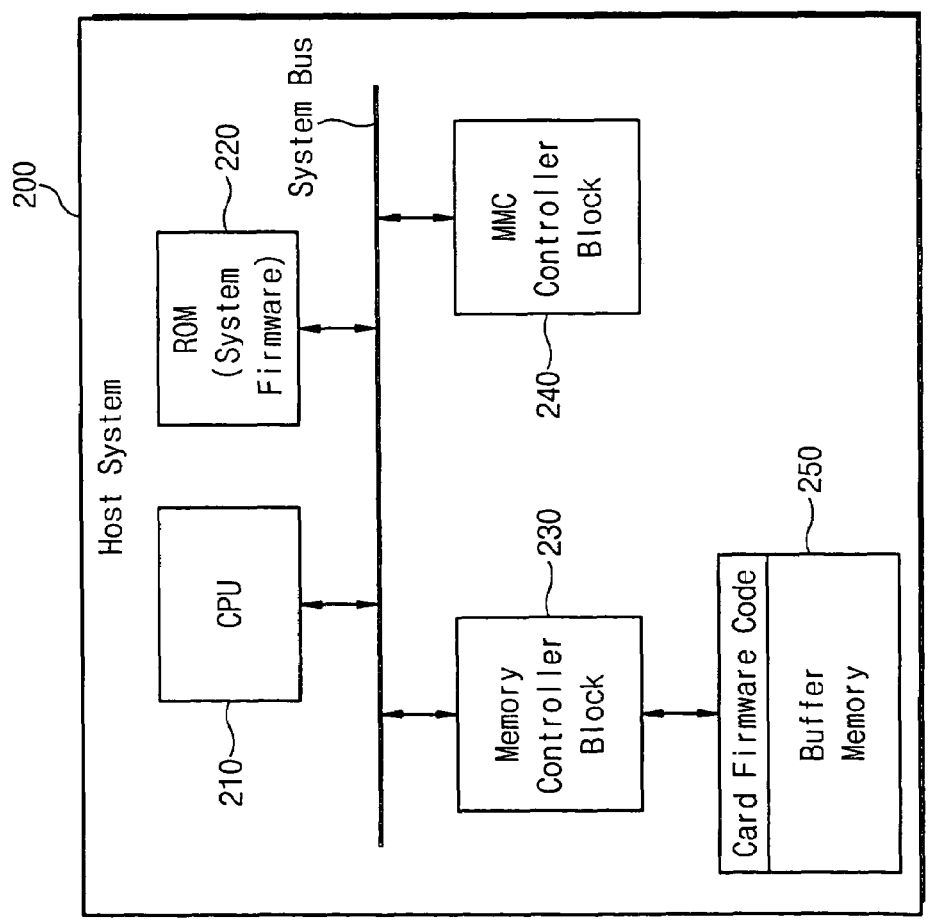
FIG. 2 is a block diagram of a memory card system with a flash memory according to some embodiments of the present invention.
Figure 2:
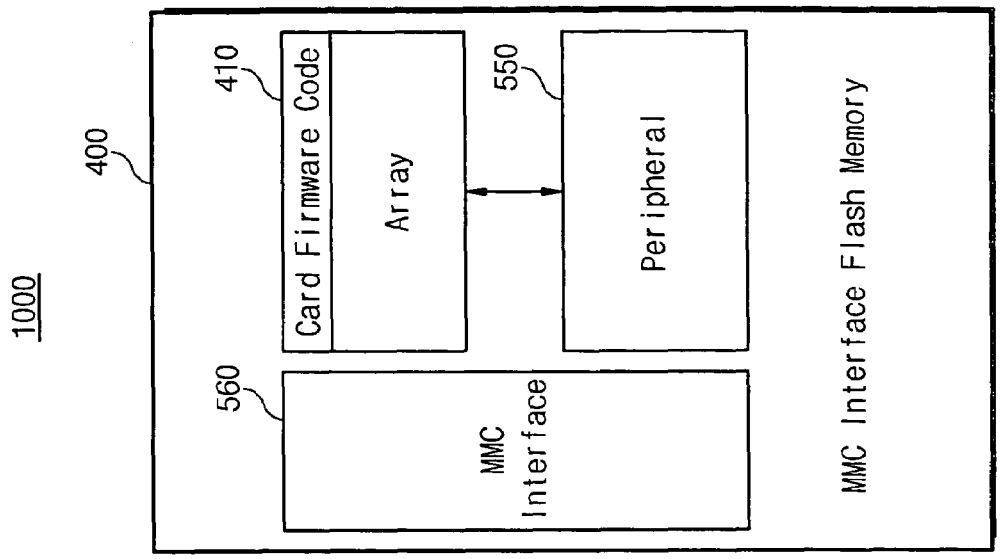

FIG. 2 illustrates a memory system 1000 with a multimedia card interface according to the present invention. The memory system 1000 includes a host 200 and a flash memory 400. The flash memory 400 is constructed to communicate with the host 200 using a multimedia card interface method, which means that the flash memory 400 is used as a multimedia card. However, it is apparent to those skilled in the art that the flash memory 400 is not limited to application of a multimedia card. The flash memory 400 includes a memory cell array 410, a peripheral block 550, and a multimedia interface block 560, which are merged into a single chip.

Card firmware code is stored in the memory cell array 410 to manage a flash memory. The card firmware code stored in the memory cell array 410 is transferred to a buffer memory 250 of the host 200 after a card identification mode of a multimedia card. The host 200 includes a CPU 210, a ROM 220 in which a system firmware is stored, a memory controller block 230, a multimedia controller block 240, and a buffer memory 250. The CPU 210 manages the flash memory 400 using the card firmware code stored in the buffer RAM 250 and manages a general operation of the host 200 using the system firmware code stored in the ROM 220. In the present invention, the host 200 outputs a physical address, instead of a logical address, to the flash memory 400 when the flash memory 400 is accessed.

Figure 3:
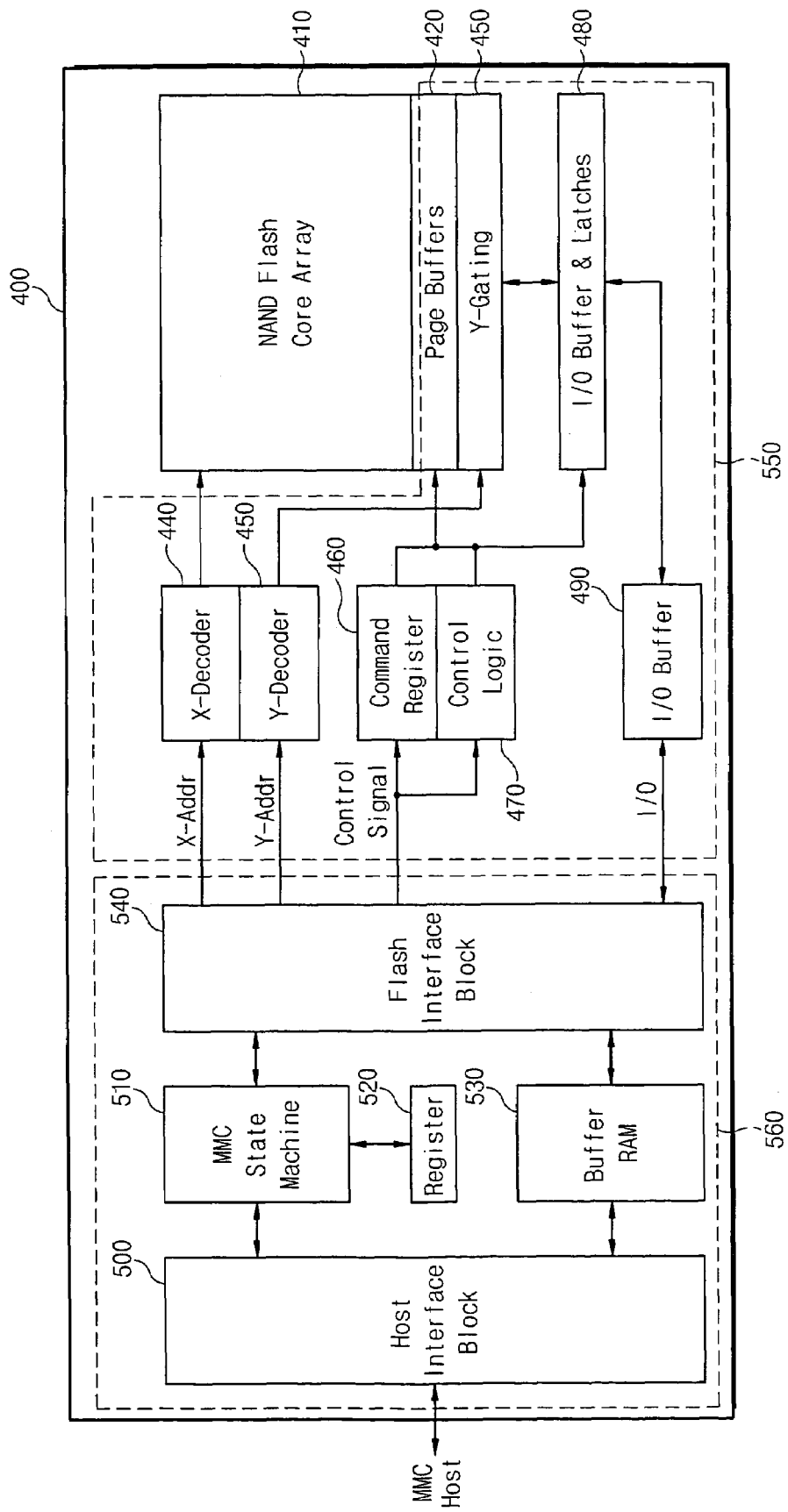
FIG. 3 is a block diagram of an exemplary flash memory illustrated in FIG. 2.

FIG. 3 is a block diagram an exemplary flash memory 400 illustrated in FIG. 2. The flash memory 400 includes a memory cell array 410, a peripheral block 550, and a multimedia card interface block 560. A card firmware code and card ID information are stored in the memory cell array 410. The card ID information is automatically read out by a peripheral block 550 at power-up and the read-out information is transmitted to the multimedia card interface block 560. The peripheral block 550 performs read/program/erase operations according to control of the multimedia card interface block 560. The peripheral block 550 includes a page buffer 420, a column gate circuit 430, row and column decoders 440 and 450, a command register 460, a control logic 470, an input/output buffer and latch circuit 480, and an input/output buffer circuit 490, which are disclosed in the foregoing U.S. Pat. No. 5,473,563 and well known to those skilled in the art and will not be described in further detail.

As illustrated in FIG. 3, the multimedia card interface block 560 includes a host interface 500, a state machine 510, a register 520, a buffer RAM 530, and a flash interface 540. The host interface 500 communicates with the host 200 using a multimedia card interface method. For example, the host interface 500 converts serial data/address transmitted from a host into a parallel data/address. The state machine 510 operates in response to a command transmitted through the host interface 500 and stores read-out card ID information from the memory cell array 410 in the register 520 at power-up. In a card identification mode, the state machine 510 outputs the card ID information stored in the register 520 in response to a command transmitted through the host interface 500. The buffer RAM 530 is constructed to temporarily store data from the host 200 during a program operation and to temporarily store read-out data from the memory cell array 410 during a read operation.

Since the buffer RAM 530 of the flash memory 400 is not used as a work memory, it may have a smaller capacity than the RAM illustrated in FIG. 1. For example, a capacity of the buffer RAM 530 is decided to buffer data of one page. The flash interface 540 is controlled by the state machine 510 and is constructed to generate control signals and address needed for read/program/erase operations. For example, the flash interface 540 is constructed to control timing needed for read/program/erase operations of a flash memory. The state machine 510 controls the card firmware code stored in the memory cell array 410 to be transmitted to a host when a command for reading a card firmware code is input after a card identification mode. That is, the state machine acts as a boot loader for reading a card firmware code.

As described above, the host 200 converts a logical address into a physical address using a card firmware code stored in the buffer RAM 250 and outputs the physical address to the flash memory 400, on the basis of a multimedia card protocol, according to a packet method. The flash memory 400 performs read/program/erase operations using a physical address from the host 200. The flash memory 400 according to the present invention acts as a multimedia card without a CPU 31 and a ROM 32 illustrated in FIG. 1. The components of the flash memory 400 are fabricated on a single chip. As previously stated, managing the flash memory 400 is conducted by the host 200 using a card firmware code.

Figure 4:
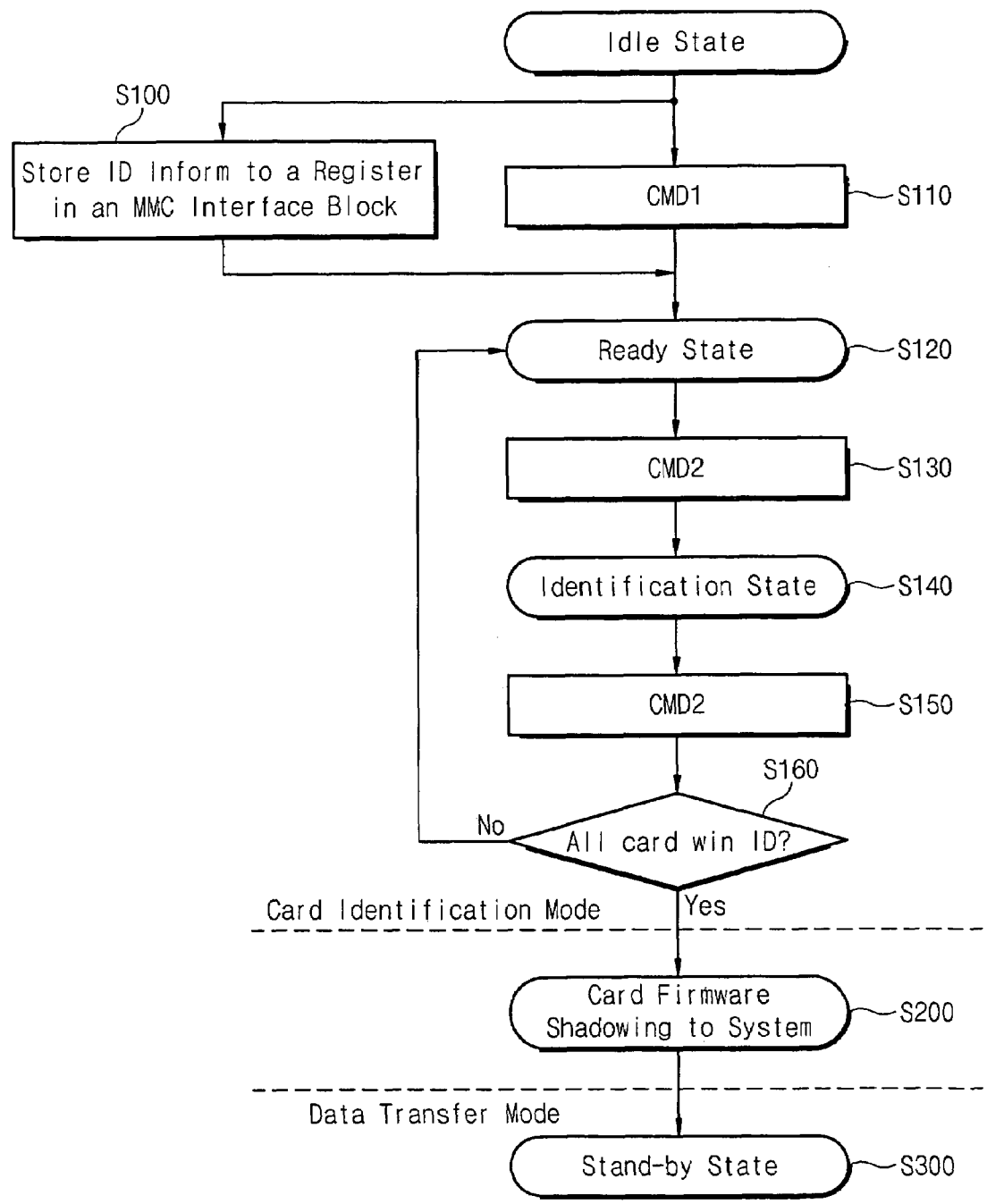
FIG. 4 is a flow chart for explaining the operations of a memory card system according to some embodiments of the present invention.

The operation of a memory card system according to the invention will now be described more fully hereinafter with reference to a flowchart of FIG. 4. As well known, if a multimedia card including a flash memory 400 according to the invention is connected to a host 200, a power is applied to the flash memory 400 from the host 200. Once the power is applied to the flash memory 400, the flash memory 400 enters a well known card identification mode. When the power is applied to the flash memory 400, card ID information stored in a memory cell array 410 is stored in a register 520 under the control of a state machine 510 (S100). The card ID information stored in the register 520 is transmitted to the host 200 using a method well known at a card identification mode. In FIG. 4, S110-S160 are steps for performing the card identification mode. The card identification mode is well know in the art and will not be described in further detail.

Once the card identification mode is completed, a card firmware code stored in the flash memory 400 is shadowed into a buffer RAM 250 of the host 200 (S200). More specifically, the host 200 outputs a command for reading the card firmware code stored in the flash memory 400 to the flash memory 400. Next, the flash memory 400 outputs a card firmware code to the host 200 in response to an input command. The card firmware code transmitted to the host 200 is stored in the buffer RAM 250. Afterwards, the flash memory 400 enters a data transfer mode (S300). During the data transfer mode, managing the flash memory 400 is wholly conducted by the host 200. Particularly, a CPU 210 of the host 200 converts a logical address into a physical address based on read/program/erase operations and outputs the physical address to the flash memory 400.

Other modifications and variations to the invention will be apparent to a person skilled in the art from the foregoing disclosure. Thus, while only certain embodiment of the invention has been specifically described herein, it will be apparent that numerous modifications may be made thereto without departing from the spirit and scope of the invention.

What is claimed is:

1. An MMC form-factor flash memory device comprising:
   a non-volatile memory cell array;
   a multimedia card interface circuit configured to interface with an external host system using a multimedia card communication protocol; and
   a peripheral circuit configured to control read/program/erase operations of the non-volatile memory cell array under the control of the multimedia card interface circuit, wherein the non-volatile memory cell array, the multimedia card interface circuit, and the peripheral circuit are on a single integrated circuit chip, wherein the multimedia card interface circuit includes a register configured to store card identification information read out of the non-volatile memory cell array by the peripheral circuit during power-up of the flash memory device.

2. The flash memory device of claim 1, wherein the non-volatile memory cell array is configured to store the card identification information and card firmware code.

3. The flash memory device of claim 2, wherein the multimedia card interface circuit is configured to output the card firmware code to the host system in response to a command from the host system after completion of a card identification mode.

4. The flash memory device of claim 1, wherein the multimedia card interface circuit comprises:
   a state machine circuit;
   a host interface circuit configured to communicate with the host system using the multimedia card interface protocol according to control of the state machine circuit;
   a flash interface circuit configured to control the peripheral circuit according to control of the host interface circuit; and
   a buffer RAM coupled between the host interface circuit and the flash interface circuit, and configured to temporarily store transfer data.

5. A memory system comprising:
   a host system; and
   a MMC form-factor flash memory configured to communicate with the host system using a multimedia card interface protocol, wherein the flash memory further comprises:
      a non-volatile memory cell array;
      a multimedia card interface circuit configured to communicate with the host system using the multimedia card communication protocol; and
      a peripheral circuit configured to control read/program/erase operations of the non-volatile memory cell array according to control of the multimedia card interface circuit, the non-volatile memory cell array, the multimedia card interface circuit, and the peripheral circuit being on a single integrated circuit chip wherein the multimedia card interface circuit includes a register configured to store card identification information read out by the peripheral circuit during power-up of the flash memory device.

6. The memory system of claim 5, wherein the flash memory comprises a multimedia card.

7. The memory system of claim 5, wherein the non-volatile memory cell array is configured to the store card identification information and card firmware code.

8. The memory system of claim 5, wherein the host system provides a command configured to read the card firmware code to the flash memory device after a card identification mode is complete and before a data transfer mode is started, and the flash memory device outputs card firmware code to the host system in response to the read command.

9. The memory system of claim 8, wherein the host system communicates with the flash memory device using the card firmware code running local to the host system.

10. The memory system of claim 9, wherein the host system provides a physical address to the flash memory device.

11. The memory system of claim 5, wherein the multimedia card interface circuit further comprises:
   a state machine circuit;

a host interface circuit configured to communicate with the host system using the multimedia card interface protocol according to control of the state machine circuit;

a flash interface circuit configured to control the peripheral circuit according to control of the state machine circuit; and a buffer RAM coupled between the host interface circuit and the flash interface circuit configured to temporarily store transfer data.

12. An MMC form-factor flash memory device comprising:

a non-volatile memory cell array; and a multimedia card interface circuit comprising a state machine circuit configured to receive and apply physical addresses from an external host system to the non-volatile memory array for access thereto.

13. A flash memory device according to claim 12 wherein the state machine circuit is further configured to transfer card firmware code from the non-volatile memory to the external host system.

14. A flash memory device according to claim 13 wherein the card firmware code is configured to translate logical addresses to physical addresses when executed locally by the external host system.

15. A flash memory device according to claim 14 wherein the state machine circuit is further configured to receive the physical addresses from the external host system.

16. A flash memory device according to claim 12 wherein the state machine circuit is configured to provide operations of the memory device without a local CPU circuit in the device.

17. A flash memory device according to claim 12 wherein the device is free of a volatile local buffer ram sufficient to store and operate the card firmware code.

18. A method of operating an MMC (MultiMedia Card) form-factor flash memory device comprising:

transferring card firmware code stored in the flash memory device to an external host system upon power-up of the flash memory device;

receiving logical-to-physical translated addresses of flash memory locations at the flash memory device;

accessing the flash memory locations using the logical-to-physical translated addresses; and outputting the card firmware code to the host system in response to a command from the host system after completion of a card identification mode.

* * * * *